United States Patent [19]
Chan et al.

[11] Patent Number: 5,471,092
[45] Date of Patent: Nov. 28, 1995

[54] METALLURGICAL JOINT INCLUDING A STRESS RELEASE LAYER

[75] Inventors: Chin-Jong Chan, Fong-Shan, Taiwan; Jei-Wei Chang, Tuckahoe; Lubomyr T. Romankiw, Briarcliff Manor, both of N.Y.

[73] Assignee: International Business Machines Corporation, Armonk, N.Y.

[21] Appl. No.: 360,528

[22] Filed: Dec. 21, 1994

Related U.S. Application Data

[63] Continuation of Ser. No. 945,309, Sep. 15, 1992.

[51] Int. Cl.⁶ .................... H01L 23/48; H01L 29/46
[52] U.S. Cl. .................... 257/753; 257/762; 257/764; 257/772; 257/751; 257/779
[58] Field of Search .................... 257/751, 753, 257/779, 766, 737, 763, 762, 772, 764

[56] References Cited

U.S. PATENT DOCUMENTS

| | | | |
|---|---|---|---|
| 4,283,118 | 8/1981 | Inoue | 257/766 |
| 4,360,142 | 11/1982 | Carpenter et al. | 228/123 |
| 4,386,116 | 5/1983 | Nair et al. | 257/762 |
| 4,505,029 | 3/1985 | Owyang et al. | 257/750 |
| 5,027,188 | 6/1991 | Owada et al. | 357/68 |
| 5,048,744 | 9/1991 | Chang et al. | 228/123 |
| 5,130,779 | 7/1992 | Agarwala et al. | 257/763 |
| 5,136,364 | 8/1992 | Byrne | 257/764 |
| 5,184,206 | 2/1993 | Neugebauer et al. | 257/762 |

FOREIGN PATENT DOCUMENTS

| | | | |
|---|---|---|---|
| 57-138160 | 8/1982 | Japan | H01L 21/92 |
| 57-154858 | 9/1982 | Japan | H01L 21/92 |
| 59-117135 | 7/1984 | Japan | H01L 21/92 |
| 59-145537 | 8/1984 | Japan | H01L 21/60 |
| 60-136339 | 7/1985 | Japan | H01L 21/92 |
| 61-43461 | 3/1986 | Japan | H01L 23/48 |
| 0155641 | 6/1989 | Japan | 257/762 |
| 357222 | 3/1991 | Japan | H01L 21/321 |

OTHER PUBLICATIONS

P. L. Beaudouin and D. A. Jeannotte, Solderable Contact, Jul. 1970 IBM Technical Disclosure Bulletin vol. 13 No. 2 p. 510.

Primary Examiner—Robert P. Limanek
Assistant Examiner—Alexander Oscar Williams
Attorney, Agent, or Firm—Philip J. Feig; Stephen S. Strunck

[57] ABSTRACT

A metallurgical joint structure between two workpieces to be joined by soldering or brazing includes a stress release layer of a low yield point metal, preferably silver, gold, copper, palladium or platinum. The joint structure also includes a juxtaposed barrier layer to prevent the diffusion of a solder element, such as tin, to the stress release layer. Preferred barrier layers are chromium, titanium-tungsten and tantalum. Preferably, the joint includes one or more stress relief layer and associated barrier layer combinations in the joint structure for improved joint reliability.

25 Claims, 2 Drawing Sheets

METALLURGICAL JOINT INCLUDING A STRESS RELEASE LAYER

RELATED APPLICATION

This application is a continuation of application Ser. No. 07/945,309, filed Sep. 15, 1992.

BACKGROUND OF THE INVENTION

The present invention relates to a metallurgical joint between two workpieces to be joined by soldering or brazing where the joint includes a stress release layer of a low yield point metal, preferably silver, gold, copper, palladium or platinum. Preferably, the joint includes one or more stress release layer and associated barrier layer combinations in the joint structure for improved joint reliability.

In the electronics industry different semiconductor components or workpieces have to be joined to each other. Usually, one or both of the semiconductor components are provided with C4 (controlled collapse chip connection) pads, and then using reflow solder these semiconductor components are joined together. The semiconductor components may be a chip or a substrate, such as for example, a multi-layer ceramic substrate.

A chip may be connected to a substrate using the effect of wetting and reaction between a completely melted solder and the pad material. In order to form a good joint with low contact resistance, the solder alloy needs to be melted completely, wet, and react with the pad material during the solder reflow joining process. The rapid reaction between the solder alloy and the pad material usually results in the formation of intermetallic compounds. Intermetallic formation at the pad/solder interface is essential for a good joint. However, growth of the intermetallic phased layer is generally believed to cause large interfacial residual stress during the subsequent cooling cycle of the solder reflow joining process. This may lead to segregation of the electrical and mechanical properties of the joint.

Such segregation in the solder often results in defects and residual stress in the solder. The reflowed solder has a solidified structure which segregates and produces non-uniform strain. During accelerated life test, such a strain can cause joint fractures and thereby reduce the service life of the over-all joint structure.

Another problem encountered in solder joining is the thermal expansion mismatch between a chip such as a silicon chip, and a module or a substrate, such as a ceramic substrate. Thermal expansion mismatch between the chip and the module produces mechanical stress in the joints because of the difference in coefficients of thermal expansion between the silicon of the circuit chip and the ceramic used for the module substrate. The thermal mismatch causes shear strain on the C4 joint and thus reduces the life of the joint.

The prior art is replete with solder joints of various differing combinations of materials. For example, in U.S. Pat. No. 5,048,744 a solder joint structure of Cr/Cu (with via-patterned Cr/polyimide layers)/Ti/Cu/Pd/solder is described. Such a joint does not include a stress release layer and an associated barrier layer. The Ti can react with Sn and Ti cannot block Sn penetration during an aggressive reflow. Once Sn penetrates into the Cu layer, the Cu can become impure, brittle and be under stress.

U.S. Pat. No. 4,360,142 describes a structure of Cr/CrCu/Cu/CrCu/Cu/Au/solder with double CrCu/Cu layers. The CrCu layer is not a barrier layer since in order to be an effective diffusion barrier layer a layer of pure Cr would have to separate the Cu and CrCu layers.

While the present invention is intended for joining any workpieces capable of being soldered or brazed, the primary application of the invention is intended for joining controlled collapse chip connection (C4) structures. Controlled collapse chip connection (C4), also known as flip-chip integration, is an attractive approach for higher integration in both microelectronic and optoelectronic circuits. As demand for high density C4 increases, the increase of the reliability of C4 technology is becoming of paramount importance.

Presently, the C4 joint comprises a Cr adhesion layer, a phased CrCu layer and a Cu layer (sometimes covered by a thin gold layer) on which PbSn (97/3%) is evaporated or plated. The entire structure may be deposited through a molybdenum mask or through a Riston mask. Alternatively, Cr, phased CrCu and Cu are deposited in the form of sheet film. PbSn is deposited through a resist mask and after the resist is removed, Cu/CrCu and Cr are selectively etched and PbSn is reflowed. As the PbSn is heated to reflow temperature, the tin dissolves into copper and forms CuSn intermetallics. A stacked C4 bump structure can develop internal stress caused by the formation of the intermetallic phased and/or by the mismatch of thermal expansion coefficients between layers. The internal stress in the structure, which stress results in failure during a pull test or accelerated thermal fatigue test, is undesirable. Therefore stress reduction in these layers become an important issue for C4 and other joint reliability.

The present invention overcomes these limitations of the prior art by providing metallurgical joints which include one or more stress release layer and barrier layer combinations.

SUMMARY OF THE INVENTION

In the present invention the metallurgical joint includes a stress release layer of a low yield point metal, preferably silver, gold, copper, palladium or platinum in combination with an associated barrier layer for providing a barrier for diffusion of tin from a solder layer. The barrier layer is preferably Cr, TiW, Ta and alloys thereof. The joint may comprise one stress release layer-barrier layer combination or multiple layers of a stress release layer-barrier layer combination.

The stress release layer prevents the transmission of stress to a substrate to which the C4 ball is to be joined and the barrier layer inhibits the formation of tin intermetallics due to the absence of tin diffusion from the solder. The resulting joint exhibits improved strength and reliability over heretofore used joints.

A principal object of the present invention is therefore the provision of a metallurgical joint having a stress release layer and an associated barrier layer.

Another object of the invention is a metallurgical joint for soldering or brazing C4 ball to a substrate.

Further and still other objects of the invention will become more clearly apparent when the following description is read in conjunction with the accompanying drawing.

DETAILED DESCRIPTION

In the prior art, workpieces have been joined by a metallurgical joint including an adhesive layer, such as Cr, applied on a substrate. A Cu—Cr phased layer is then applied on the adhesive layer. A reactive metal layer, such as Cu, is applied to the phased layer and a solder ball is connected to the reactive metal layer.

A joint of the prior art design described above was built. After solder reflow, the cross-section was investigated using TEM (Transmission Electron Microscope). Tin was found to penetrate into the phased CrCu layer and react with Cu and form intermetallics. The intermetallic was identified as $Cu_3Sn$ by both EDX (Energy-Dispersive X-Ray Analysis) and x-ray diffraction.

It was concluded is that the formation of $Cu_3Sn$ and the thermal expansion mismatch in the joint induced stress.

A joint can develop internal stress resulting from the formation of the intermetallic phased Cu—Sn and/or by the mismatch of the thermal expansion coefficients between layers. The internal stress results in failure during pull test or accelerated thermal fatigue test, thereby reducing joint reliability.

In accordance with the teachings of the present invention, a barrier layer and a stress release layer are added to the metallurgical joint in order to improve joint reliability.

Figure 1:
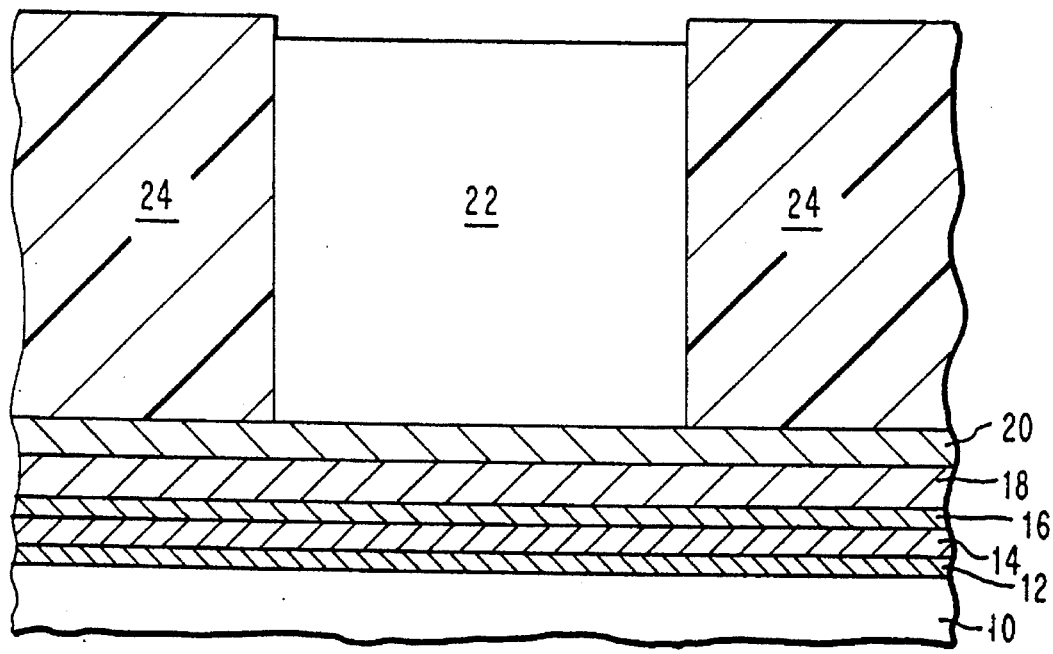
FIG. 1 is a schematic representation of a preferred embodiment of a metallurgical joint in accordance with the teachings of the present invention.

Referring now to the figures and to FIG. 1 in particular, there is shown schematically a sequence of layers for forming a metallurgical joint in accordance with the teachings of the present invention. A substrate 10 has an adhesive layer 12, such as Cr, evaporated thereon through a mask or evaporated as a sheet film. A stress release layer 14, such as Cu is evaporated onto the adhesive layer. The layer 14 may be evaporated through a mask or in sheet film form. A barrier layer 16, such as Cr, is then evaporated on the stress release layer 14. A phased layer 18, such as CuCr, is evaporated on the barrier layer 16. A reactive metal 20, such as Cu, is evaporated on the phased layer. Solder 22 is plated onto the layer Cu 20 through a resist or Mo mask 24. The layer 20 is selected to form intermetallics with the solder used and the layer 18 is selected to improve the joining of the intermetallic to the barrier layer. Subsequent to the removal of the resist, the Cu layer 20, CuCr layer 18 and the barrier layer 16 are etched. The PbSn solder is reflowed. As the PbSn solder is heated to its reflow temperature, Sn dissolves into the Cu and CuSn intermetallics form. Such intermetallics are not formed in the stress release layer 14.

Figure 2:
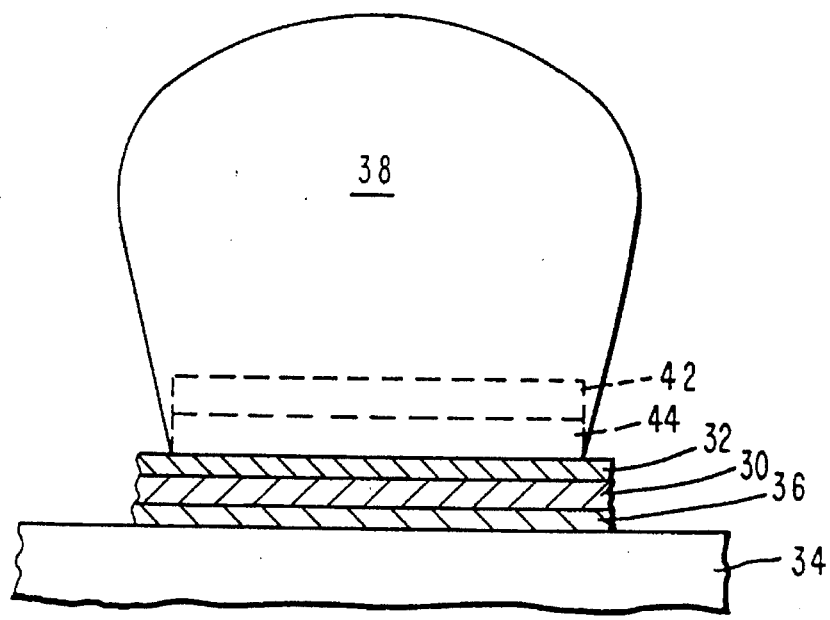
FIG. 2 is a schematic representation of an embodiment of present invention after reflow.
Figure 3:
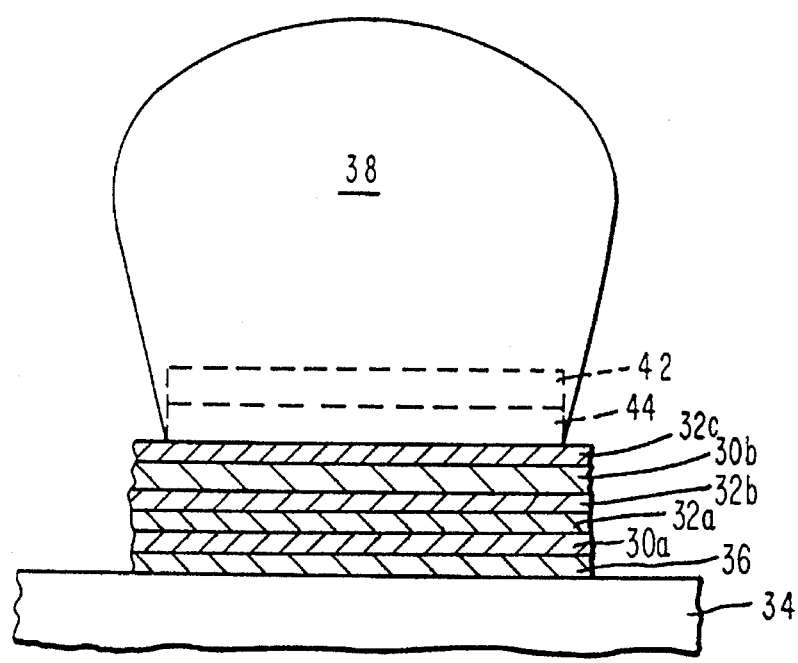
FIG. 3 is a schematic of an alternative embodiment of the invention.

In order to further assure the stress release effect, one or more combinations of a stress release layer 30 and barrier layer 32 are extended in the joint to prevent the penetration of reflowed solder through the side wall of the C4 bump as shown in FIG. 2. This is shown in FIG. 3. The numbering of the layers in this figure inidicates like layers in FIG. 2. The letters "a" and "b" have been appended to the numbers to indicate different layers of the same material. Similar improvements in reliability are manifest when stress release layer 14 and barrier layer 16 are employed as shown in FIG. 1.

In the joint shown in FIG. 2, a substrate 34 has an adhesive layer 36 applied thereto. A preferred adhesive layer is Cr however, Ta and Ti and alloys thereof are also useful as adhesive layers.

The stress release layer 30 is a low yield strength metal, preferably Cu, but alternatively Ag, Au, Pd or Pt, for preventing the transmission of stress to the substrate 34. The thickness of the stress release layer 30 applied to the layer 36 is preferably in the range between 50 and 50000 Å.

The barrier layer 32 is provided to prevent the diffusion of Sn from a solder layer 38 into the stress release layer 30. The solder layer is preferably PbSn, AuSn, PbIn, AuIn AuInSn or BiSn. Cr is a preferred metal for use as a barrier layer, however TiW and Ta and alloys thereof are also useful as a barrier layer. The barrier layer 32 prevents the formation of intermetallics in layer 30 which reduce the reliability of a joint. The barrier layer is completely insoluble with the metal on either side and must be pore free.

A phased metal layer 44, such as CrCu, is applied to the barrier layer 32. A solder reactive metal layer 42, such as Cu is deposited on the top of layer 44. Solder is selectively deposited through a resist mask. Before PbSn is reflowed and the Cu layer 42 and the phased metal layer 44 are electroetched. The barrier layer 32 is chemically etched so as to leave the layer 32 slightly larger than the layers 42 and 44 above. The remaining Cu stress release underlayer 30 is protected after etching as shown in FIG. 2.

The solder-reactive metal for layer 42 is selected for its solderability and preferably is CuCr, Cu, Ni, Co, Au, Ag, Pd, Pt, Rh, Ni(P), Co(P) and combinations of one or more layers of these materials.

Multiple combinations of a stress release layer 30 and barrier layer 32 can be added to the joint structure.

Figure 4:
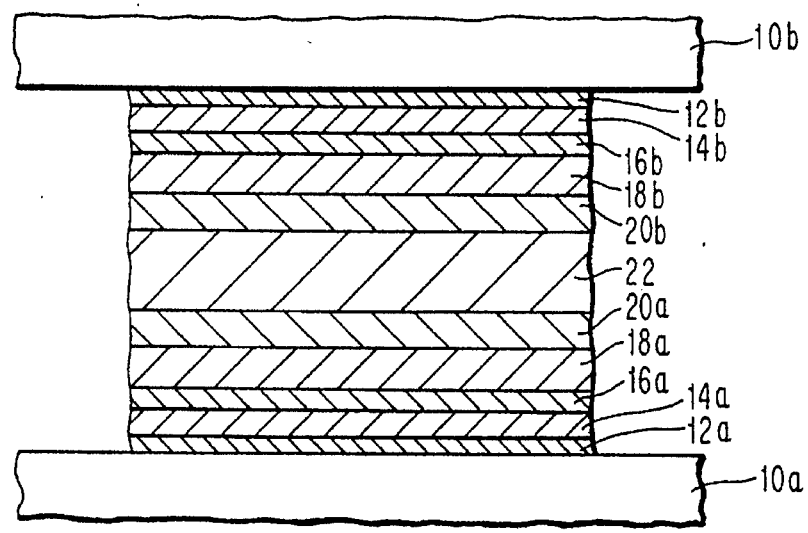
FIG. 4 is a schematic of another alternative embodiment of the invention.

It will be apparent to those skilled in the art that a joint structure is possible in accordance with the teachings of the present invention, where instead of joining a chip directly to the solder layer, a "reverse" joint can be interposed between the solder layer and the the chip. That is, the joint structure would be a first workpiece/adhesive layer/stress release layer/barrier layer/phased metal layer/solder reactive metal layer/solder layer/solder reactive metal layer/phased metal layer/barrier layer/stress release layer/adhesive layer/a second workpiece. The joint includes at least one barrier layer-stress release layer combination disposed between a respective workpiece and the solder layer. This is shown in FIG. 4. The numbering of the layers in this figure indicates like layers in FIG. 2. The letters "a" and "b" have been appended to the numbers where there are two different layers of the same material.

A joint of the FIG. 2 design described above was built. After solder reflow, the cross-section was investigated by TEM (Transmission Electron Microscope). Till intermetallic compound was found in the Cu and phased CrCu layer. No Sn was detected in stress release Cu layer by a nano-probe of EDX (Energy-Dispersive X-Ray Analysis) in TEM. The Cr barrier layer successfully stopped Sn diffusion. The stress release layer Cu was protected to reduce the joint stress.

Further experiments were then conducted to demonstrate that internal stress is reduced by the incorporation of a stress release layer.

EXAMPLES

A 4.7×4.7×0.02 cm glass structure with known Poison's ratio and elastic modulus were metallized by e-beam evaporation. The joints were formed as shown in Table 1.

TABLE 1

Structure and Internal Stress

| Structure | Configuration of Structure | Internal Stress |
| --- | --- | --- |
| A | Sn/Cu/Sn/Cu/Sn/Cu/Cr(200 Å)/(Glass | 215 MPa |
| B | Sn/Cu/Sn/Cu/Sn/Cu/Cr(300 Å)/Cu(700 Å)/Cr(20 Å/Glass | 111 MPa |
| C | Sn/Cu/Sn/Cu/Sn/Cu/Cr(300 Å)/Ag(700 Å)/Cr(200 Å)/Glass | 53 MPa |
| D | Sn/Cu/Sn/Cu/Sn/Cu/TiW(300 Å)/Cu(700 Å)/Cr(200 Å)/Glass | 84 MPa |
| E | Sn/Cu/Sn/Cu/Sn/Cu/Cr(300 Å)/Au(700 Å)/Cr(200 Å)/Glass | 54 MPa |

In order to simulate the complete reaction of $Cu_3Sn$ in a structure, the Sn and Cu were laminated with layer thicknesses calculated to form $Cu_3Sn$. The internal stress of structure A, B, C, D and E in Table 1 was computed by measuring substrate curvatures before and after solder reflow. Each reflowed structure has a 2 μm $Cu_3Sn$ layer confirmed by x-ray diffraction and TEM.

After solder reflow, the presence of $Cu_3Sn$ resulted in a tensile stress of 215 MPa in joint structure A in Table 1. In joint structure B, an additional 300 Å Cr barrier layer and 700 Å Cu stress relief layer was applied between the first Cu/Sn layers and the Cr/glass. After solder reflow, TEM examination showed that $Cu_3Sn$ formation in the stress release layer was prevented by the Cr barrier layer. Nano-EDX analysis indicated the absence of Sn in the stress release Cu underlayer. The results demonstrate that Cr is a good barrier metal for preventing Sn diffusion in the Cu underlayer. During reflow, the Cu underlayer is annealed which makes the Cu ductile and deformable thereby accommodating thermal mismatch and reducing stress in the joint structure.

As shown in Table 1, the joint structure B with a barrier layer/stress release layer, the internal stress was reduced by almost one-half to 115 MPa.

When the Cu stress relief layer was replaced by a 700 Å Ag stress relief layer in joint structure C, the internal stress was reduced even further to 53 MPa.

In the joint structure D, the barrier layer used was 300 Å TiW with the original stress release layers of 700 Å of Cu, which resulted in an internal stress of 84 MPa. The stress was reduced to approximately one-third of the internal stress of joint structure A.

In the joint structure E, the barrier layers used 300 Å Cr with 700 Å of Au as the stress release layer. The resulting internal stress was 54 MPa, which is approximately one-fourth of the internal stress of joint structure A.

The joint is useful for any metallurgical joint for joining workpieces by soldering or brazing. The invention is particularly useful for C4 joining and tape automated bonding technology.

While there have been described and illustrated a preferred metallurgical joint and several modifications and variations thereof, it will be apparent to those skilled in the art that further modifications and variations are possible without deviating from the broad scope of the present invention which shall be limited solely by the scope of the claims appended hereto.

What is claimed is:

1. A metallurgical joint between a first workpiece and a second workpiece to be joined comprising:

a first workpiece, an adhesive layer coupled to said first workpiece;

a low yield point metal stress release layer coupled to said adhesive layer;

a barrier layer which does not react with Sn and will block Sn penetration into the stress release layer selected from the group consisting of Cr, TiW, Ta and alloys of Cr, TiW or Ta coupled to said stress release layer;

a phased metal layer coupled to said barrier metal layer;

a solder reactive metal layer selected from the group consisting of CrCu, Cu, Ni, Co, Au, Ag, Pd, Pt, Rh, Ni(P), Co(P) and combinations thereof coupled to said phased metal layer;

a solder layer selected from the group consisting of PbSn, AuSn, PbIn, AuIn, AuInSn and BiSn coupled to said solder reactive layer and isolated from said low yield point metal stress release layer by said barrier layer, and a second workpiece coupled to said solder layer.

2. A metallurgical joint as set forth in claim 1 wherein said adhesive layer is selected from the group consisting of Cr, Ta and Ti and alloys of Cr, Ta or Ti.

3. A metallurgical joint as set forth in claim 1 wherein said stress release layer is selected from the group consisting of Ag, Au, Cu, Pd and Pt.

4. A metallurgical joint as set forth in claim 3 wherein said adhesive layer is Cr.

5. A metallurgical joint as set forth in claim 1 wherein said second workpiece is a controlled collapse chip connection.

6. A metallurgical joint as set forth in claim 1 wherein said first and said second workpieces are joined by tab automated bonding.

7. A metallurgical joint between a first workpiece and a second workpiece to be joined comprising:

a first workpiece;

an adhesive layer coupled to said first workpiece;

a first low yield point metal stress release layer coupled to said adhesive layer;

a first barrier layer which does not react with Sn and will block Sn penetration into the stress release layer selected from the group consisting of Cr, TiW, Ta and alloys of Cr, TiW or Ta coupled to said first stress release layer;

at least one additional low yield point metal stress release layer interleaved with an associated at least one additional barrier layer which does not react with Sn and will block Sn penetration, said interleaved layers being coupled to said first barrier layer;

a phased metal layer coupled to a last of said barrier layers;

a solder reactive metal layer selected from the group consisting of Cr Cu, Cu, Ni, Co, Au, Ag, Pd, Pt, Rh, Ni(P), Co(P) and combinations thereof coupled to said phased metal layer;

a solder layer selected from the group consisting of PbSn,

Au Sn, PbIn, AuIn AuInSn and BiSn coupled to said solder reactive layer and isolated from said low yield point metal stress release layer by one of said barrier layers; and a second workpiece coupled to said solder layer.

8. A metallurgical joint as set forth in claim 7, wherein said adhesive layer is selected from the group consisting of Cr, Ta and Ti and alloys of Cr, Ta or Ti.

9. A metallurgical joint as set forth in claim 7, wherein said first and said at least one additional stress release layers are selected from the group consisting of Ag, Au, Cu, Pd and Pt.

10. A metallurgical joint as set forth in claim 9, wherein said adhesive layer is Cr.

11. A metallurgical joint as set forth in claim 7, wherein said second workpiece is a controlled collapse chip connection.

12. A metallurgical joint as set forth in claim 7, wherein said first and said second workpieces are joined by tab automated bonding.

13. A metallurgical joint between a first workpiece and a second workpiece to be joined comprising:

a first workpiece, a first adhesive layer coupled to said first workpiece;

a first low yield point metal stress release layer coupled to said first adhesive layer;

a first barrier layer which does not react with Sn and will block Sn penetration selected from the group consisting of Cr, TiW, Ta and alloys of Cr, Ti or Ta coupled to said first stress release layer;

a first phased metal layer coupled to said first barrier metal layer;

a first solder reactive metal layer selected from the group consisting of CrCu, Cu, Ni, Co, Au, Ag, Pd, Pt, Rh, Ni(P), Co(P) and combinations thereof coupled to said first phased metal layer;

a solder layer selected from the group consisting of PbSn, AuSn, PbIn, AuIn AuInSn and BiSn coupled to said solder reactive layer and isolated from said low yield point metal stress release layer by said barrier layer; and a second solder reactive metal layer selected from the group consisting of CrCu, Cu, Ni, Co, Au, Ag, Pd, Pt, Rh, Ni(P), Co(P) and combinations thereof coupled to said solder layer;

a second phased metal layer coupled to said second solder reactive metal layer;

a second barrier layer which does not react with Sn and will block Sn penetration selected from the group consisting of Cr, TiW, Ta and alloys of Cr, TiW, or Ta coupled to said second phased metal layer;

a second low yield point metal stress release layer coupled to said second barrier layer;

a second adhesive layer coupled to said second stress release layer; and a second workpiece coupled to said second adhesive layer.

14. A metallurgical joint as set forth in claim 13 wherein said first and said second adhesive layer are selected from the group consisting of Cr, Ta and Ti and alloys of Cr, Ta or Ti.

15. A metallurgical joint as set forth in claim 13 wherein said first and said second stress release layers are selected from the group consisting of Ag, Au, Cu, Pd and Pt.

16. A metallurgical joint as set forth in claim 15 wherein said first and said second adhesive layers are Cr.

17. A metallurgical joint as set forth in claim 13 wherein said second workpiece is a controlled collapse chip connection.

18. A metallurgical joint as set forth in claim 13, wherein said first and said second workpieces are joined by tab automated bonding.

19. A metallurgical joint between a first workpiece and a second workpiece to be joined comprising:

a first workpiece;

a first adhesive layer coupled to said first workpiece;

a first low yield point metal stress release layer coupled to said first adhesive layer;

a first barrier layer which does not react with Sn and will block Sn penetration selected from the group consisting of Cr, TiW, Ta and alloys of Cr, TiW, or Ta coupled to said first stress release layer;

at least one additional low yield point metal stress release layer interleaved with an associated at least one additional barrier layer, said interleaved layers being coupled to said first barrier layer;

a first phased metal layer coupled to a last of said barrier layers;

a first solder reactive metal layer selected from the group consisting of CrCu, Cu, Ni, Co, Au, Ag, Pd, Pt, Rh, Ni(P), Co(P) and combinations thereof coupled to said first phased metal layer;

a solder layer selected from the group consisting of PbSn, AuSn, PbIn, AuIn AuInSn and BiSn coupled to said first solder reactive layer and isolated from low yield point metal stress release layers by at least one of said barrier layers; and a second solder reactive metal layer selected from the group consisting of CrCu, Cu, Ni, Co, Au, Ag, Pd, Pt, Rh, Ni(P), Co(P) and combinations thereof coupled to said solder layer;

a second phased metal layer coupled to said second solder reactive metal layer;

a second barrier layer selected from the group consisting of Cr, TiW, Ta and alloys of Cr, TiW or Ta coupled to said second phased metal layer;

a second low yield point metal stress release layer coupled to said second barrier layer;

at least one additional barrier layer interleaved with an associated at least one additional stress release layer, said interleaved layers being coupled to said second stress release layer;

a second adhesive layer coupled to a last of said stress release layers; and a second workpiece coupled to said second adhesive layer.

20. A metallurgical joint as set forth in claim 19, wherein said first and second adhesive layers are selected from the group consisting of Cr, Ta and Ti and alloys of Cr, Ta or Ti.

21. A metallurgical joint as set forth in claim 19, wherein said first said second and said at least one additional stress release layers are selected from the group consisting of Ag, Au, Cu, Pd and Pt.

22. A metallurgical joint as set forth in claim 21, wherein said first and said second adhesive layers are Cr.

23. A metallurgical joint as set forth in claim 19, wherein said second workpiece is a controlled collapse chip connection.

24. A metallurgical joint as set forth in claim 19, wherein said first and said second workpieces are joined by tab automated bonding.

25. A metallurgical joint between a first workpiece and a second workpiece to be joined comprising:

a first workpiece, an adhesive layer coupled to said first workpiece;

a low yield point metal stress release layer coupled to said adhesive layer;

a barrier layer coupled to said stress release layer which barrier layer does not react with Sn and will block Sn penetration into the stress release layer and is isolated from the first workpiece and the adhesive layer by said low yield point metal stress release layer, said barrier layer selected from the group consisting of Cr, TiW, Ta and alloys of Cr, TiW or Ta;

a phased metal layer coupled to said barrier metal layer;

a solder reactive metal layer selected from the group consisting of CrCu, Cu, Ni, Co, Au, Ag, Pd, Pt, Rh, Ni(P), Co(P) and combinations thereof coupled to said phased metal layer;

a solder layer selected from the group consisting of solders that are Sn alloys and In alloys coupled to said solder reactive layer and isolated from said low yield point metal stress release layer by said barrier layer, and a second workpiece coupled to said solder layer.

* * * * *